US011300588B2

(12) United States Patent
Peschke

(10) Patent No.: US 11,300,588 B2
(45) Date of Patent: Apr. 12, 2022

(54) ADAPTER FOR A CURRENT PROBE AND TESTING SYSTEM

(71) Applicant: Rohde & Schwarz GmbH & Co. KG, Munich (DE)

(72) Inventor: Martin Peschke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1326 days.

(21) Appl. No.: 15/494,321

(22) Filed: Apr. 21, 2017

(65) Prior Publication Data

US 2018/0306840 A1 Oct. 25, 2018

(51) Int. Cl.
*G01R 15/18* (2006.01)
*G01R 1/067* (2006.01)
*G01R 15/14* (2006.01)

(52) U.S. Cl.
CPC ..... *G01R 1/06788* (2013.01); *G01R 1/06766* (2013.01); *G01R 15/144* (2013.01)

(58) Field of Classification Search
CPC ...... G01R 1/06; G01R 1/067; G01R 1/06766; G01R 1/06788
See application file for complete search history.

(56) References Cited

U.S. PATENT DOCUMENTS

| | | | | |
|---|---|---|---|---|
| 5,382,893 A * | 1/1995 | Dehnel | ............ | H02J 9/061 320/160 |
| 5,590,179 A * | 12/1996 | Shincovich | ............ | G01D 4/004 379/106.06 |
| 2006/0284681 A1 * | 12/2006 | Pollock | ............ | H03H 7/24 330/284 |
| 2007/0257657 A1 * | 11/2007 | Stevens | ............ | G01R 15/202 324/72.5 |
| 2008/0084201 A1 * | 4/2008 | Kojori | ............ | G01R 19/0015 324/117 R |
| 2010/0060303 A1 * | 3/2010 | Beckmann | ............ | G01R 31/006 324/750.01 |
| 2013/0015843 A1 * | 1/2013 | Doogue | ............ | G01R 15/148 324/202 |
| 2014/0320153 A1 * | 10/2014 | Johnson | ............ | G01R 1/06788 324/713 |
| 2015/0054492 A1 * | 2/2015 | Mende | ............ | G01R 19/2503 324/115 |
| 2016/0072307 A1 * | 3/2016 | Kato | ............ | H02J 50/12 307/104 |
| 2016/0084879 A1 * | 3/2016 | Luo | ............ | G01R 1/0416 324/127 |
| 2018/0136264 A1 * | 5/2018 | Steuer | ............ | G01R 19/257 |

* cited by examiner

*Primary Examiner* — Huy Q Phan
*Assistant Examiner* — David B Frederiksen
(74) *Attorney, Agent, or Firm* — Christensen O'Connor Johnson Kindness PLLC

(57) ABSTRACT

An adapter for a current probe is described, said adapter being configured to be connected with said current probe. Said adapter enables a voltage measurement by using said adapter and said current probe. Said adapter comprises a current loop and at least one transconductance unit. Said transconductance unit transforms the voltage to be measured into a current wherein the current obtained is forwarded by said current loop. Further, a testing system is described.

8 Claims, 3 Drawing Sheets

ADAPTER FOR A CURRENT PROBE AND TESTING SYSTEM

FIELD OF THE DISCLOSURE

Embodiments of the present disclosure relate generally to an adapter for a current probe as well as a testing system.

BACKGROUND

In the state of the art, testing systems are known that comprise a probe and a measurement device such as an oscilloscope for performing measurements on a device under test, in particular for receiving signals of the device under test.

Depending on the measurements to be done, different probes are used for contacting the device under test in a defined manner. For instance, current probes are available that use a transformer or a Hall element in order to measure the current of the device under test. Current probes are also called current clamps due to the specific design. Furthermore, current probes may comprise a so-called Rogowski coil for measuring alternating currents or high-speed current pulses. In general, the current probes available do not break the circuit to be measured. In addition, a galvanic connection to the device under test is not provided.

Besides the current probes, voltage probes are known that are used for measuring voltages of a device under test in a defined manner, for instance a voltage across a load, resistor or any other suitable component. The voltage probes may be galvanically isolated in order to ensure high bandwidths, for instance optically isolated. Alternatively or supplementary, the voltage probes are used with oscilloscopes having galvanically isolated inputs. However, the voltage probes known and the oscilloscopes with galvanically isolated inputs are very expensive.

A direct current (DC) coupled, galvanically isolated voltage measurement with high bandwidth, for instance DC to 100 MHz or higher, is of interest when a voltage between two nodes is to be measured wherein none of the nodes is at ground. Galvanically isolated voltage probes do not have a signal path to ground resulting in an unlimited common-mode input resistance. Accordingly, the DC common-mode rejection of these probes is at least two orders of magnitude higher than that of a differential probe having a common-mode input resistance being at 10 MΩ, for instance.

Up to now, a customer who wants to make such measurements described above has to use an expensive oscilloscope and/or an expensive galvanically isolated voltage probe.

SUMMARY

Accordingly, there is a need for an easy and cost-efficient possibility to perform voltage measurements with high bandwidth.

To address this need, among others, embodiments of the present disclosure provide an adapter for current probes, the adapter being configured to be connected with the current probe. The adapter enables a voltage measurement by using the adapter and the current probe. The adapter further comprises a current loop and at least one transconductance unit that transforms the voltage to be measured into a current wherein the current obtained is forwarded by the current loop.

Further, a testing system is provided in order to address this need wherein the testing system comprises a current probe and an adapter as described above.

Accordingly, a cost-efficient possibility is provided in order to perform direct current (DC) coupled, galvanically isolated voltage measurements with high bandwidth by using the adapter in combination with the current probe being less expensive than a galvanically isolated voltage probe. The high bandwidth is ensured due to the fact that a current probe is used in combination with the adapter and a measurement device such as an oscilloscope. Simultaneously, the galvanic isolation is also ensured due to the transconductance unit. Therefore, a high common-mode rejection ratio (CMRR) is provided by using the testing system, in particular the adapter in combination with the current probe. Further, a linear behavior of the testing system is ensured with regard to the voltage to be measured wherein the testing system comprises the adapter and the current probe. The transconductance unit is a unit that puts out a current being proportional to its input voltage. Generally, transconductance is also called mutual conductance being an electrical characteristic that relates the current through an output to the voltage across its input. In general, the adapter, in particular the transconductance unit, is configured to transform the voltage to be measured into a current in a defined manner. This ensures a determination of the voltage to be measured while using a current probe.

According to an aspect, the current loop forms an adapter interface being configured to be connected with the current probe. Thus, the current loop of the adapter is coupled with the current probe in order to ensure that the signal provided by the adapter is forwarded to the current probe. In other words, the current probe is enabled to sense the (current) signal provided by the current loop, in particular the adapter interface. Particularly, the (current) signal forwarded relates to the voltage to be measured of the device under test being contacted appropriately.

According to another aspect, the transconductance unit is integrated in the current loop. Therefore, the output of the transconductance unit is forwarded to the current loop directly ensuring a defined measurement. The current loop interfaces with the current probe provided that the adapter is installed.

For instance, the transconductance unit comprises at least one series resistor. The series resistor converts a voltage applied into a current that is sensed by the current probe provided that the adapter is installed in the current probe. In some embodiments, the transconductance unit is formed by the at least one series resistor.

Furthermore, the transconductance unit may comprise an active transconductance amplifier. The active transconductance amplifier, also called operational transconductance amplifier (OTA), is an amplifier that outputs a current depending on the differential input voltage, namely the voltage between two nodes. The transconductance amplifier has a high resistive output. In addition, the transconductance amplifier may be used with negative feedback.

According to another aspect, the current loop has a positioning element, the positioning element positioning the current loop symmetrically with regard to the current probe. This improves the common-mode rejection (ratio) of the testing system, in particular the adapted being used with the current probe, as the current loop is symmetrically positioned within the current probe with respect to the nodes.

According to an embodiment, the current loop is made of a printed circuit board or a wire. The printed circuit board may be a rigid one, a semi-flexible one or a flexible one. This depends on the application intended for the adapter, in particular the application intended of the whole testing system. A rigid printed circuit board ensures a high symmetry of the whole testing system, in particular the current loop, as the relative positions are fixed whereas a (semi-) flexible printed circuit board or a wire provides more flexibility with regard to contacting the device under test.

The adapter may be configured to enable galvanically isolated voltage measurements by using the current probe. Thus, a less expensive possibility is given in order to perform galvanically isolated voltage measurements as it is not needed to buy an expensive voltage probe being galvanically isolated. In some embodiments, the adapter can be used to perform DC coupled, galvanically isolated voltage measurements with high bandwidth.

According to another aspect, the adapter comprises two input ports being the ends of the current loop. The input ports of the adapter are used for contacting the device under test, in particular to sense the voltage across the device under test that is converted into a current being sensed by the current probe appropriately. The two input ports relate to the nodes between which the (differential) voltage is to be measured.

Further, the current probe may comprise a current sensing unit. The current sensing unit is configured to sense a current that is input to the current probe, in particular via the adapter installed in the current probe. Thus, the current obtained by transforming the voltage is sensed in the current probe, in particular the current sensing unit of the current probe.

According to an embodiment, the current sensing unit is established by a current probe transformer that transforms the current input appropriately for further processing.

Moreover, the current sensing unit may be established by a Hall element, a Rogowski coil, an iron vane, etc.

Generally, the current sensing unit is configured to provide a non-invasive current sensing.

The current loop of the adapter may be fed through the current sensing unit. Thus, a current flowing through the current loop is sensed by the current sensing unit while interacting appropriately, for instance via its magnetic field.

Moreover, the current loop may be fed through the current sensing unit with more than one winding. Accordingly, the sensitivity of the measurement is increased. Particularly, the sensitivity increases with the number of windings fed through the sensing unit.

According to another aspect, a positioning element is provided, the positioning element being configured to position the current loop symmetrically in the center of the current sensing unit. This ensures that an accurate measurement can be done due to the symmetric position of the current loop within the current probe. Further, the current mode rejection (ratio) is improved.

For instance, the positioning element may be part of the adapter or the current probe.

The current probe may have a core being configured to accommodate the current loop. Thus, the current probe is established by a clamp probe that accommodates the adapter appropriately, in particular the current loop of the adapter.

According to a certain embodiment, the core is at least partly split such that core has a first state for receiving the current loop and a second state for performing the measurement. The first state corresponds to an open state wherein the current loop can be positioned within the core configured to accommodate the current loop whereas the second state corresponds to the closed state such that the current sensing unit being located in the core at least partly surrounds the current loop in order to ensure an accurate sensing.

For instance, the split core is hinged. Thus, two portions of the core can be swiveled with respect to each other in order to position the core in the first state and/or the second state.

According to another embodiment, the core is a solid one. The solid core improves the measurement accuracy as it is ensured that the core remains in its intended position.

In some embodiments, the current loop is separable wherein the current loop is separated for accommodating the current loop in the core. Using a solid core, the current loop cannot be hinged into the core since the core cannot be opened for accommodating the current loop. Hence, the current loop has to be fed through the solid core in another manner. The current loop may have an interface that is established by a plug/socket connection wherein the current loop is positioned with its interface in the core, in particular the solid core. Alternatively, the plug is formed such that it can be fed through the accommodation provided by the solid core wherein the separable ends of the current loop are connected with each other in order to close the current loop appropriately.

Further, an oscilloscope may be provided that is connected with the current probe. Thus, the testing system ensures that voltage measurements with high bandwidth can be performed by using an oscilloscope wherein a current probe is used as well as the adapter being installed in the current loop.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawing, wherein

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
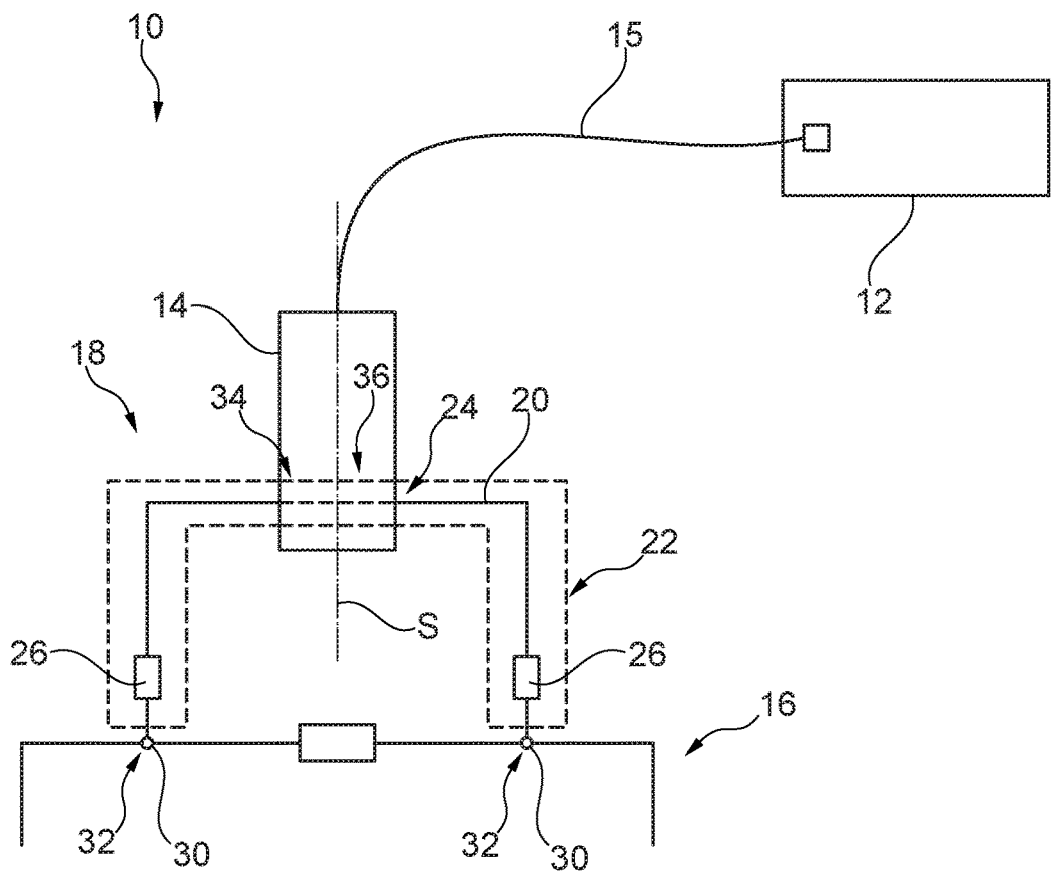
FIG. 1 shows a schematic overview of a testing system according to a first embodiment.

In FIG. 1, a testing system 10 is shown that comprises a measurement device 12 established by an oscilloscope and a current probe 14 that is connected to the oscilloscope 12 via a probe cable 15. Further, the testing system 10 comprises a device under test 16 that is measured via the testing system 10.

The testing system 10 also comprises an adapter 18 that is used in conjunction with the current probe 14 in order to ensure voltage measurements on the device under test 16 even though a current probe 14 is provided. The adapter 18 comprises a current loop 20 that is fed through the current probe 14 being configured to sense a current running through the current loop 20. Further, the adapter 18 has at least one transconductance unit 22 that is configured to transform the voltage to be measured into a current wherein the voltage to be measured corresponds to the voltage across the device under test 16. The current obtained by the transconductance unit 22 is forwarded to the current loop 20 such that the current probe 14 senses the current running through the current loop relating to the voltage to be measured.

Accordingly, the current loop 20 forms an adapter interface 24 that is configured to be connected with the current probe 14. The adapter interface 24 ensures that the current loop 20 can be accommodated in the current probe 14.

In the shown embodiment, the transconductance unit 22 is integrated in the current loop 20 since the transconductance unit 22 is formed by two series resistors 26 that are symmetrically arranged within the current loop 20 with respect to a symmetry axis S of the current probe 14.

In general, the current loop 20 may be made of printed circuit board 28 as shown in FIG. 1, for instance a (semi-) flexible printed circuit board. Thus, the current loop 20 is maintained in its defined position ensuring high accurate measurements.

As already discussed, the adapter 18 is configured to enable galvanically isolated voltage measurements by using the current probe 14 since the voltage to be measured across the device under test 16 is transformed into a current that is forwarded to the current probe 14 by the adapter 18.

For contacting the device under test 16, the adapter 18 comprises two input ports 30 being formed by the ends 32 of the current loop 20 as shown in FIG. 1.

The current probe 14 itself has a current sensing unit 34 that is configured to sense the current running through the current loop 20 of the adapter 18. For instance, the current sensing unit 34 is established by a current probe transformer.

The current sensing unit 34 is positioned in the proximity of a core 36 of the current probe 14 that is configured to accommodate the current loop 20. For instance, the current sensing unit 34 is established by a current probe transformer 38. Alternatively, the current sensing unit 32 can be used by any other suitable unit that is configured to sense a current.

As the current loop 20 of the adapter 18 is fed through the current probe 14, the current loop 20 is fed through the current sensing unit 34 in order to ensure that the current flowing through the current loop 20 is sensed by the current sensing unit 34.

In order to increase the sensitivity of the measurement, the current loop 20 may be fed through that current sensing unit 34 with more than one winding. For instance, this is disclosed in the embodiment shown in FIG. 6.

Figure 2:
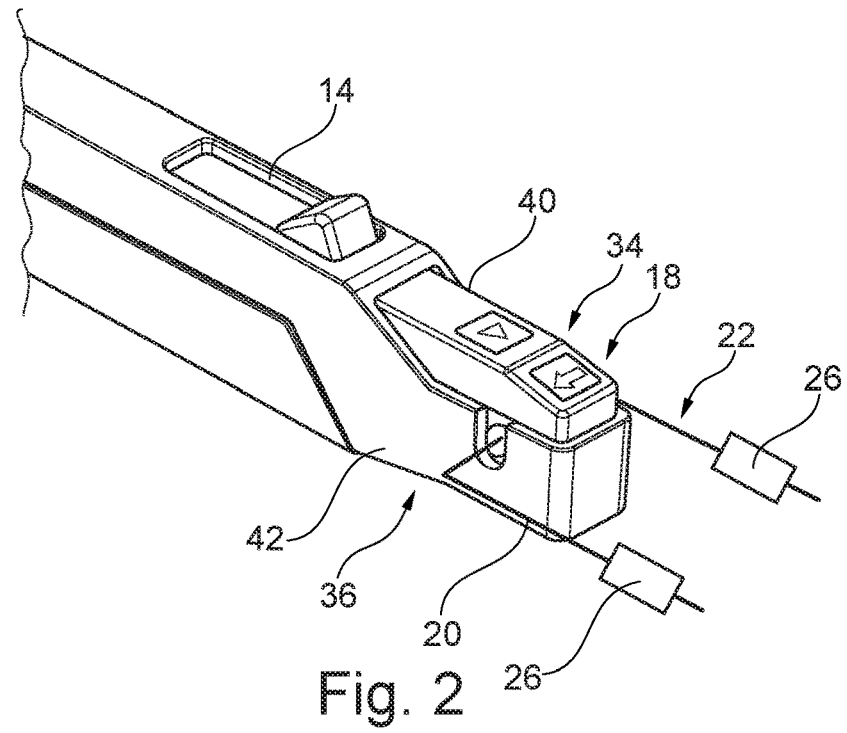
FIG. 2 shows a perspective view of the testing system shown in FIG. 1.

In FIG. 2, it is also shown that the core 36 of the current probe 14 is at least partly split such that the core has a first portion 40 and a second portion 42 that can be swiveled with respect to each other as the split core 36 is hinged appropriately. Thus, the split core 36 has two different states, namely an open state for receiving the current loop 20 of the adapter 18 and a closed state for performing the measurements. In the closed state, the current sensing unit 34 encircles the current loop 20.

Figure 3:
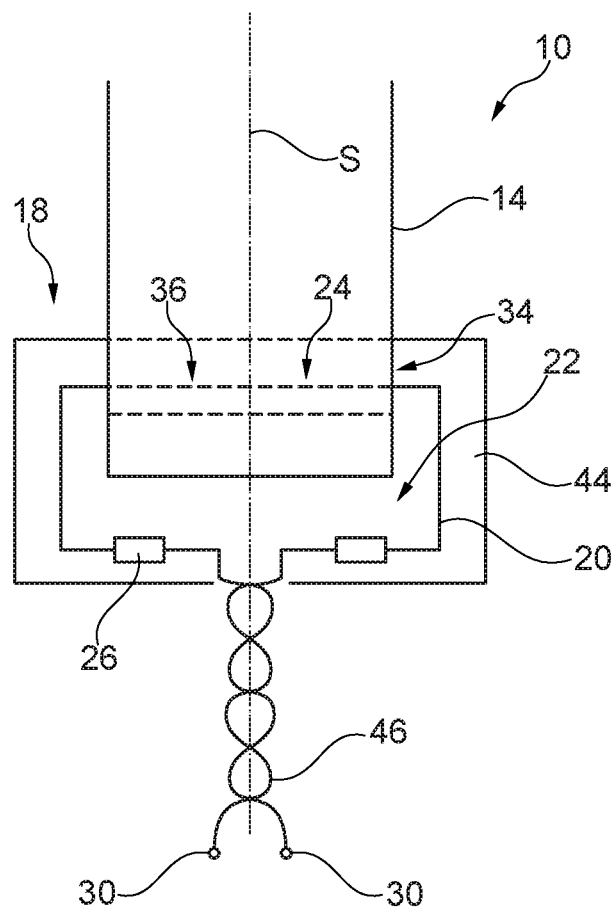
FIG. 3 shows a schematic of a testing system according to a second embodiment.

In FIG. 3 a second embodiment of the testing system 10 is shown, in particular the current probe 14 and the adapter 18.

The adapter 18 according to this embodiment comprises a positioning element 44 being established by a carrier, housing or support. Generally, the positioning element 44 ensures that the current loop 20 is positioned symmetrically in the center of the current sensing unit 34 of the current probe 14.

Due to the symmetric positioning of the current loop 20 in the current probe 14, the common-mode rejection (ratio) of the testing system 10 is improved, in particular the common-mode rejection (ratio) of the adapter 18.

The positioning element 44 may also be established by a printed circuit board, and in some embodiments a rigid or semi-flexible one.

Furthermore, the current loop 20 of the adapter 18 is at least partly formed by a wire 46. Thus, the testing system 10 can be used to contact a device under test 16 in a flexible manner due to the flexible wire 46.

In an alternative embodiment, the positioning element 44 is a part of the current probe 14 wherein the current loop 20 is placed on the positioning element 44 such that the current loop 20 is positioned in a defined manner. This ensures that the adapter interface 24 of the current loop 20 is located at the optimal position with regard to the current sensing unit 34. Hence, a high symmetry is guaranteed due to the positioning element 44.

Figure 4:
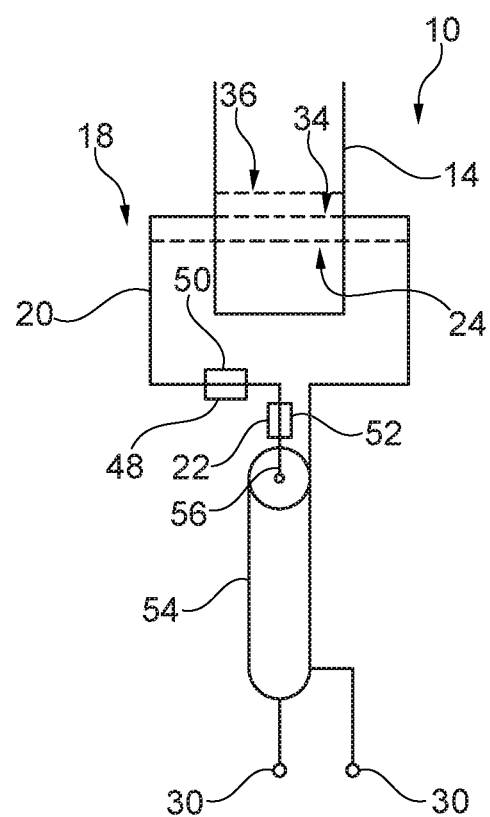
FIG. 4 shows a schematic of a testing system according to a third embodiment.

Turning to FIG. 4, a third embodiment of the testing system 10 is shown. The current probe 14 according to this embodiment has a solid core 36 that cannot be opened in order to accommodate the current loop 20. Thus, the current loop 20 cannot be hinged within the core 36 as shown in the embodiment of FIGS. 1 and 2, for instance.

In order to feed the current loop 20 through the current probe 14, in particular the current sensing unit 34, the current loop 20 is separable wherein the current loop 20 is separated for being accommodated in the core 36.

Thus, the current loop 20 has an interface 48 that is established by a plug socket/connection 50, for instance. The current loop 20 is separated via the plug/socket connection 50 such that at least a portion of the current loop 20 can be fed through the solid core 36, for instance the portion having the plug.

Afterwards, both portions of the current loop 20 are connected to each other via the interface 48, and in some embodiments the plug/socket connection 50, in order to provide a closed current loop 20 used for voltage measurement by using the current probe 14.

In addition, the transconductance unit 22 is formed by an active transconductance amplifier 52 in the shown embodiment wherein the active transconductance amplifier 52 is integrated in the current loop 20. This ensures that the voltage to be measured is transformed into a current that can be sensed by the current probe 14 wherein the signal is amplified simultaneously.

Moreover, the adapter 18 comprises a coaxial cable 54 wherein the transconductance amplifier 52 is connected to the center line 56 of the coaxial cable 54. Hence, a cost-efficient connection is established being asymmetric.

Figure 5:
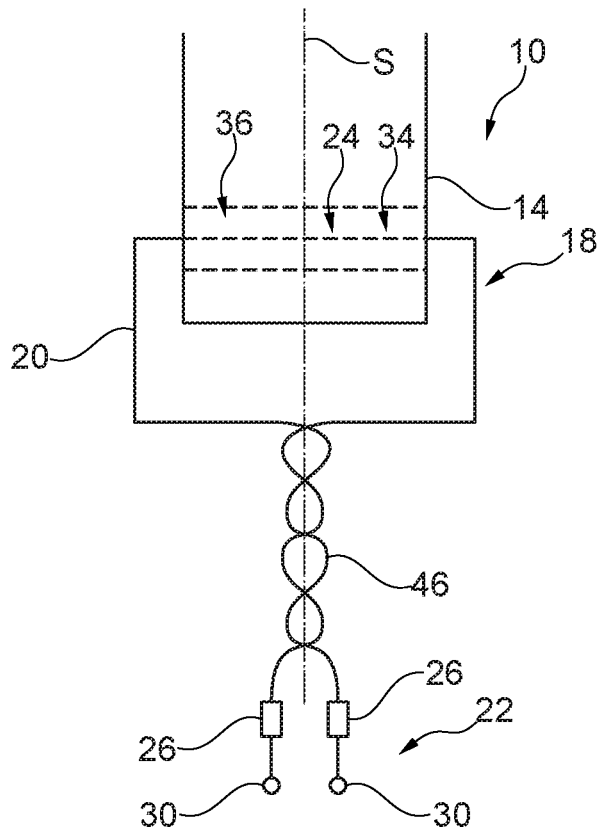
FIG. 5 shows a schematic overview of a testing system according to a fourth embodiment.

Referring to FIG. 5, a fourth embodiment is shown that differs from the one shown in FIG. 3 in that no positioning element 44 is provided. In fact, the current loop 20 is established by the wire 46 that is fed through the current probe 14, in particular the core 36.

The transconductance unit 22 is established by two series resistors 26. Alternatively, the transconductance unit 22 may be established by a single transconductance amplifier such that one end of the wire 46 can be fed through the core 36 being a solid one.

Figure 6:
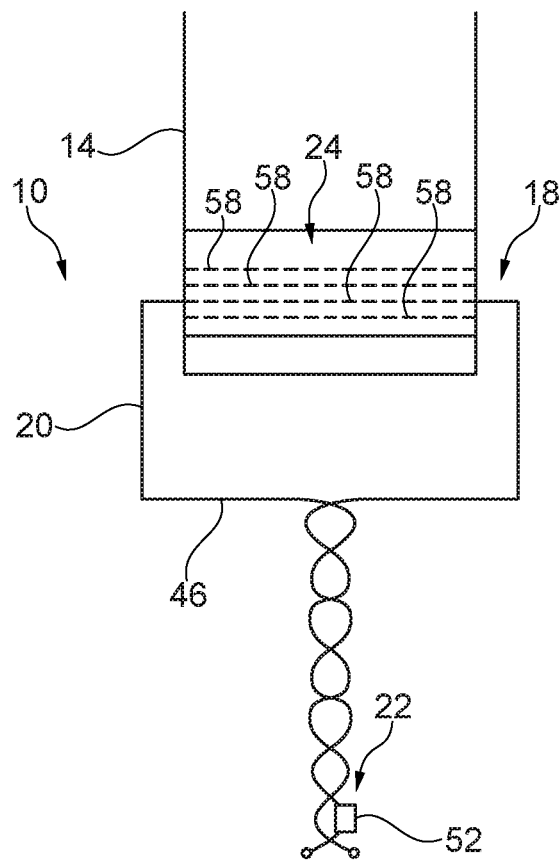
FIG. 6 shows a schematic overview of a testing system according to a fifth embodiment.

Turning now to FIG. 6, a fifth embodiment is shown. According to this embodiment, the current loop 20 is fed through the core 36 by several windings 58 in order to increase the sensitivity of the testing system 10. The core 36 has enough space to accommodate the several windings 58. Therefore, the adapter interface 24 is established by several windings 58.

Further, it is shown that the transconductance unit 22 is established by a single transconductance amplifier 52 as shown in the embodiment of FIG. 4. Accordingly, the core 36 may be a solid one as one end 32 of the current loop 20 can be fed through the solid core 36 several times in order to provide the several windings 58. For ensuring the flexibility, the current loop 20 is formed by a wire 46 in some embodiments.

Accordingly, a cost efficient possibility is provided to perform galvanically isolated voltage measurements with high bandwidth using an oscilloscope 12 since a current probe 14 is used in combination with the adapter 18.

Due to the adapter 18 the customer has a solution for voltage and current measurements without the need for buying two separately formed probes, namely a current probe and a galvanically isolated voltage probe.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An adapter for a current probe, said adapter being configured to be connected with said current probe, said adapter enabling a voltage measurement by using said adapter and said current probe, said adapter comprising:
   a current loop and at least one transconductance unit, said transconductance unit transforming the voltage to be measured into a current, the current obtained being forwarded by said current loop;
   wherein said current loop forms an adapter interface being configured to be accommodated in said current probe such that said current loop interfaces with said current probe provided that said adapter is installed;
   wherein said current loop includes a positioning element, said positioning element being established by a carrier, a housing, a printed circuit board or a support, said positioning element positioning said current loop symmetrically within said current probe with respect to nodes of said transconductance unit; and
   wherein said adapter is configured to enable galvanically isolated voltage measurements by using said current probe.

2. The adapter according to claim 1, wherein said transconductance unit is integrated in said current loop.

3. The adapter according to claim 1, wherein said transconductance unit comprises at least one series resistor.

4. The adapter according to claim 1, wherein said transconductance unit comprises an active transconductance amplifier.

5. The adapter according to claim 1, wherein said current loop is made of a printed circuit board or a wire.

6. The adapter according to claim 1, wherein said adapter comprises two input ports being the ends of said current loop.

7. An adapter for a current probe, said adapter being configured to be connected with said current probe, said adapter enabling a voltage measurement by using said adapter and said current probe, said adapter comprising:
   a current loop and at least one transconductance unit, said transconductance unit transforming the voltage to be measured into a current, the current obtained being forwarded by said current loop;
   said transconductance unit being integrated in said current loop,
   wherein said current loop forms an adapter interface being configured to be accommodated in said current probe such that said current probe is enabled to sense a current signal provided by the adapter interface accommodated in said current probe; and
   wherein the current signal, which is provided by said adapter interface and sensed by said current probe, relates to a voltage measured across a device under test being contacted by two input ports that are ends of said current loop.

8. An adapter for a current probe, said adapter being configured to be connected with said current probe, said adapter enabling a voltage measurement by using said adapter and said current probe, said adapter comprising:
   a current loop and at least one transconductance unit, said transconductance unit configured to transform a voltage to be measured into a current, the current obtained by the transconductance unit being forwarded by said current loop, thereby ensuring a determination of the voltage to be measured by galvanically isolated voltage measurements while using the current probe; and
   wherein the current loop is configured to be accommodated in said current probe such that said current probe is enabled to sense a current signal provided by said current loop accommodated in said current probe, said current signal being obtained by converting a voltage sensed across a device under test by said current loop.

* * * * *